United States Patent
Seko et al.

(10) Patent No.: US 12,098,282 B2
(45) Date of Patent: Sep. 24, 2024

(54) FILM-FORMING COMPOSITION, SILICON-CONTAINING FILM, AND RESIST PATTERN-FORMING METHOD

(71) Applicant: JSR CORPORATION, Tokyo (JP)

(72) Inventors: Tomoaki Seko, Tokyo (JP); Tomoya Taji, Tokyo (JP); Nozomi Satou, Tokyo (JP); Hiromitsu Tanaka, Tokyo (JP); Tatsuya Sakai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 986 days.

(21) Appl. No.: 16/942,938

(22) Filed: Jul. 30, 2020

(65) Prior Publication Data

US 2020/0354575 A1 Nov. 12, 2020

Related U.S. Application Data

(63) Continuation of application No. PCT/JP2019/002564, filed on Jan. 25, 2019.

(30) Foreign Application Priority Data

Feb. 5, 2018 (JP) .................. 2018-018693

(51) Int. Cl.
| | | |
|---|---|---|
| G03F 7/075 | (2006.01) | |
| C08G 77/12 | (2006.01) | |
| C08G 77/18 | (2006.01) | |
| C08G 77/48 | (2006.01) | |
| C08L 83/14 | (2006.01) | |
| G03F 7/11 | (2006.01) | |
| G03F 7/20 | (2006.01) | |
| G03F 7/32 | (2006.01) | |

(52) U.S. Cl.
CPC .............. *C08L 83/14* (2013.01); *C08G 77/12* (2013.01); *C08G 77/18* (2013.01); *C08G 77/48* (2013.01); *G03F 7/0752* (2013.01); *G03F 7/0757* (2013.01); *G03F 7/11* (2013.01); *G03F 7/2004* (2013.01); *G03F 7/325* (2013.01); *C08L 2203/16* (2013.01)

(58) Field of Classification Search
CPC ........ G03F 7/0757; G03F 7/0752; G03F 7/11; C08G 77/12; C08G 77/14

See application file for complete search history.

(56) References Cited

U.S. PATENT DOCUMENTS

| | | | | |
|---|---|---|---|---|
| 6,207,728 | B1 * | 3/2001 | Sekiguchi ................ | C09D 4/00 522/86 |
| 2005/0215713 | A1 * | 9/2005 | Hessell ............. | H01L 21/02282 525/162 |
| 2007/0269653 | A1 * | 11/2007 | Kanamori .............. | B01J 31/069 428/447 |
| 2011/0236835 | A1 * | 9/2011 | Fu ........................... | G03F 7/091 430/315 |
| 2013/0183830 | A1 | 7/2013 | Takeda et al. | |
| 2013/0233826 | A1 * | 9/2013 | Seko ..................... | G03F 7/094 524/111 |
| 2019/0025699 | A1 | 1/2019 | Suzuki et al. | |

FOREIGN PATENT DOCUMENTS

| | | |
|---|---|---|
| JP | 2004168748 A | 6/2004 |
| JP | 2011090164 A | 5/2011 |
| JP | 2015094910 A | 5/2015 |
| JP | 2016027370 A | 2/2016 |
| WO | WO-2012039337 | 3/2012 |
| WO | WO-2017169487 A1 | 10/2017 |

OTHER PUBLICATIONS

International Search Report issued Apr. 2, 2019 in PCT Application No. PCT/JP2019/002564 filed Jan. 25, 2019 (with English translation), 5 pages.
Written Opinion issued Apr. 2, 2019 in PCT Application No. PCT/JP2019/002564 filed Jan. 25, 2019 (with English translation), 7 pages.
Office Action issued May 10, 2022 in Japanese Patent Application No. 2019-569089 (with English translation), 6 pages.
Office Action issued Aug. 22, 2023 in Korean Patent Application No. 10-2020-7022056 (with English translation), 12 pages.

* cited by examiner

*Primary Examiner* — Daborah Chacko-Davis
(74) *Attorney, Agent, or Firm* — Element IP, PLC

(57) ABSTRACT

A film-forming composition includes a compound including a Si—H bond and an orthoester. The compound preferably includes a structural unit that is a structural unit represented by formula (1-1), a structural unit represented by formula (1-2), or a combination thereof. In the formula (1-1) and the formula (1-2), $R^1$ and $R^2$ each represent a hydroxy group, a halogen atom, or a monovalent organic group having 1 to 20 carbon atoms; and $R^3$ represents a substituted or unsubstituted divalent hydrocarbon group having 1 to 20 carbon atoms that bonds to two Si atoms.

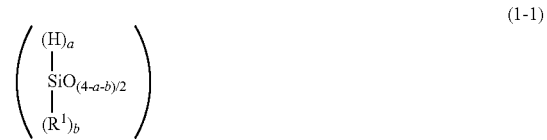

(1-1)

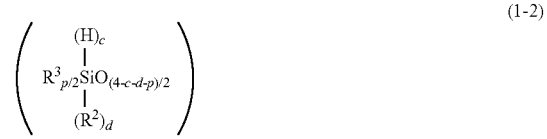

(1-2)

20 Claims, No Drawings

FILM-FORMING COMPOSITION, SILICON-CONTAINING FILM, AND RESIST PATTERN-FORMING METHOD

CROSS-REFERENCE TO RELATED APPLICATIONS

The present application is a continuation application of International Application No. PCT/JP2019/002564, filed Jan. 25, 2019, which claims priority to Japanese Patent Application No. 2018-018693, filed Feb. 5, 2018. The contents of these applications are incorporated herein by reference in their entirety.

BACKGROUND OF THE INVENTION

Field of the Invention

The present invention relates to a film-forming composition, a silicon-containing film, and a resist pattern-forming method.

Description of the Related Art

In production of semiconductor devices, a semiconductor lithography process is frequently employed which includes: exposing and developing a resist film laminated via an organic underlayer film, a silicon-containing film, and/or the like on a substrate; and using a resist pattern thus obtained as a mask to permit etching (see PCT International Publication No. 2012/039337).

SUMMARY OF THE INVENTION

According to an aspect of the present invention, a film-forming composition includes: a compound including a Si—H bond; and an orthoester.

According to another aspect of the present invention, a silicon-containing film is formed from the film-forming composition.

According to a further aspect of the present invention, a resist pattern-forming method includes applying a film-forming composition directly or indirectly on an upper face of a substrate to form a silicon-containing film. A resist composition is applied on an upper face of the silicon-containing film to form a resist film. The resist film is exposed. The resist film exposed is developed. The film-forming composition includes: a compound comprising a Si—H bond; and an orthoester.

DESCRIPTION OF EMBODIMENTS

Recently, highly enhanced integration of semiconductor devices has progressed further, and an exposure light to be used tends to have a shorter wavelength, as from a KrF excimer laser beam (248 nm) or an ArF excimer laser beam (193 nm) to an extreme ultraviolet ray (13.5 nm; hereinafter, may be also referred to as "EUV").

Under current circumstances, in which microfabrication of resist patterns has been enhanced to have a line width of no greater than 20 nm as formed by exposure to an extreme ultraviolet ray, followed by development, there is a requirement for a silicon-containing film which improves a resist film resolution and a resist pattern collapse-inhibiting property. Film thickness of silicon-containing films has become thinner, to a level of no greater than 10 nm, whereby a required level for resistance to etching by an oxygen-based gas has become even greater.

According to an embodiment of the present invention, a film-forming composition for a semiconductor lithography process contains: a compound having a Si—H bond; and an orthoester.

Another embodiment of the present is a silicon-containing film formed from the film-forming composition of the embodiment of the present invention.

Yet another embodiment of the present invention is a resist pattern-forming method including: applying a film-forming composition for a semiconductor lithography process directly or indirectly on at least an upper face of a substrate; applying a resist composition on an upper face of a silicon-containing film formed by the applying; exposing a resist film formed by the resist composition-applying; and developing the resist film exposed, wherein the film-forming composition contains: a compound comprising a Si—H bond; and an orthoester.

According to the film-forming composition of the embodiment of the present invention, storage stability in which the film-forming composition is superior is demonstrated, and formation of a silicon-containing film which is superior with regard to each of a resist film resolution, a resist pattern collapse-inhibiting property, and resistance to etching by an oxygen-based gas is enabled. The silicon-containing film of the other embodiment of the present invention is superior in the resist film resolution, the resist pattern collapse-inhibiting property, and resistance to etching by an oxygen-based gas. The resist pattern-forming method of the yet another embodiment of the present invention enables formation of a resist pattern with the resist film resolution, the resist pattern collapse-inhibiting property, and resistance to etching by an oxygen-based gas each being superior. Therefore, these can be suitably used in the manufacture of semiconductor devices and the like, in which further progress of miniaturization is expected in the future.

Hereinafter, a film-forming composition for a semiconductor lithography process, a silicon-containing film, and a resist pattern-forming method according to embodiments of the present invention will be described in detail.

Film-Forming Composition for Semiconductor Lithography Process

The film-forming composition for a semiconductor lithography process of one embodiment of the present invention (hereinafter, may be also referred to as simply "film-forming composition") contains: a compound having a Si—H bond (hereinafter, may be also referred to as "(A) compound" or "compound (A)"); and an orthoester (hereinafter, may be also referred to as "(B) orthoester" or "orthoester (B)"). The film-forming composition may contain, as a favorable component, a solvent (hereinafter, may be also referred to as "(C) solvent" or "solvent (C)"), and may also contain, within a range not leading to impairment of the effects of the present invention, other optional component(s). The film-forming composition can be suitably used for a semiconductor lithography process.

The film-forming composition containing the compound (A) and the orthoester (B) enables the storage stability to be superior, and enables formation of a silicon-containing film having a resist film resolution (hereinafter, may be also referred to as simply "resolution"), a resist pattern collapse-inhibiting property (hereinafter, may be also referred to as simply "collapse-inhibiting property"), and resistance to etching by an oxygen-based gas each being superior. Although not necessarily clarified and without wishing to be bound by any theory, the reason for achieving the aforementioned effects by the film-forming composition due to involving such a constitution may be presumed, for example, as in the following. Due to using the compound (A), which has the Si—H bond, a proportion of silicon contained and/or a film density of the silicon-containing film can be increased, thereby enabling improvement in resistance to etching by an oxygen-based gas. Furthermore, since the film-forming composition contains the orthoester (B), the film density of the silicon-containing film can be increased, thereby enabling each of the resolution, the collapse-inhibiting property, and resistance to etching by an oxygen-based gas to be improved. Further, by inhibiting hydrolysis of the compound (A), an increase in a molecular weight of the compound (A) can be suppressed, enabling improvement in the storage stability. Hereinafter, each component will be described.

(A) Compound

The compound (A) has the Si—H bond. The compound (A) may be contained in the film-forming composition either alone of one type, or in a combination of two or more types thereof. As a structural unit containing the Si—H bond, the compound (A) may have, for example, a first structural unit (hereinafter, may be also referred to as "structural unit (I)") shown below.

Structural Unit (I)

The structural unit (I) is at least one selected from the group consisting of a structural unit represented by the following formula (1-1), and a structural unit represented by the following formula (1-2).

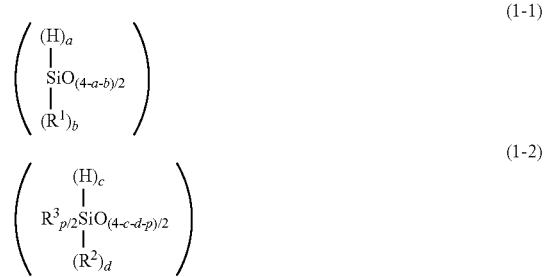

In the above formula (1-1), "a" is an integer of 1 to 3; $R^1$ represents a hydroxy group, a halogen atom, or a monovalent organic group having 1 to 20 carbon atoms; and b is an integer of 0 to 2, wherein in a case in which b is 2, two $R^1$s are identical or different, and wherein a sum of "a" and b is no greater than 3.

In the above formula (1-2), c is an integer of 1 to 3; $R^2$ represents a hydroxy group, a halogen atom, or a monovalent organic group having 1 to 20 carbon atoms; d is an integer of 0 to 2, wherein in a case in which d is 2, two $R^2$s are identical or different; $R^3$ represents a substituted or unsubstituted divalent hydrocarbon group having 1 to 20 carbon atoms that bonds to two Si atoms; and p is an integer of 1 to 3, wherein in a case in which p is no less than 2, a plurality of $R^3$s are identical or different, and wherein a sum of c, d, and p is no greater than 4.

The monovalent organic group having 1 to 20 carbon atoms which may be represented by $R^1$ or $R^2$ is exemplified by: a monovalent hydrocarbon group having 1 to 20 carbon atoms; a monovalent group having 1 to 20 carbon atoms that contains a divalent hetero atom-containing group between two adjacent carbon atoms of the monovalent hydrocarbon group; a monovalent group having 1 to 20 carbon atoms obtained by substituting with a monovalent hetero atom-containing group, a part or all of hydrogen atoms included in the monovalent hydrocarbon group or the group that contains a divalent hetero atom-containing group; a monovalent group containing —O— in combination with the monovalent hydrocarbon group having 1 to 20 carbon atoms, the monovalent group having 1 to 20 carbon atoms that contains a divalent hetero atom-containing group between two adjacent carbon atoms of the monovalent hydrocarbon group, or the monovalent group having 1 to 20 carbon atoms obtained by substituting with a monovalent hetero atom-containing group, a part or all of hydrogen atoms included in the monovalent hydrocarbon group or the group that contains a divalent hetero atom-containing group; and the like.

Exemplary monovalent hydrocarbon groups containing 1 to 20 carbon atoms include a monovalent chain hydrocarbon group having 1 to 20 carbon atoms, a monovalent alicyclic hydrocarbon group having 3 to 20 carbon atoms, and a monovalent aromatic hydrocarbon group having 6 to 20 carbon atoms.

Examples of the monovalent chain hydrocarbon group having 1 to 20 carbon atoms include: alkyl groups such as a methyl group and an ethyl group; alkenyl groups such as an ethenyl group; alkynyl groups such as an ethynyl group; and the like.

Examples of the monovalent alicyclic hydrocarbon group having 3 to 20 carbon atoms include: monovalent monocyclic alicyclic saturated hydrocarbon groups such as a cyclopentyl group and a cyclohexyl group; monovalent monocyclic alicyclic unsaturated hydrocarbon groups such as a cyclopentenyl group and a cyclohexenyl group; monovalent polycyclic alicyclic saturated hydrocarbon groups such as a norbornyl group and an adamantyl group; monovalent polycyclic alicyclic unsaturated hydrocarbon groups such as a norbornenyl group and a tricyclodecenyl group; and the like.

Examples of the monovalent aromatic hydrocarbon group having 6 to 20 carbon atoms include: aryl groups such as a phenyl group, a tolyl group, a xylyl group, a naphthyl group, a methylnapthyl group, and an anthryl group; aralkyl groups such as a benzyl group, a napthylmethyl group, and an anthrylmethyl group; and the like.

The hetero atom constituting the divalent hetero atom-containing group and the monovalent atom-containing group is exemplified by an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the divalent hetero atom-containing group include —O—, —CO—, —S—, —CS—, —NR'—, a combination of two or more of these, and the like, wherein R' represents a hydrogen atom or a monovalent hydrocarbon group. Of these, —O— or —S— is preferred.

Examples of the monovalent hetero atom-containing group include a halogen atom, a hydroxy group, a carboxy group, a cyano group, an amino group, a sulfanyl group, and the like.

A number of carbon atoms in the monovalent organic group which may be represented by $R^1$ or $R^2$ is preferably 1 to 10, and more preferably 1 to 6.

The halogen atom which may be represented by $R^1$ or $R^2$ is preferably a chlorine atom.

$R^1$ and $R^2$ represent preferably the monovalent chain hydrocarbon group, the monovalent aromatic hydrocarbon group, or the monovalent group obtained by substituting with a monovalent hetero atom-containing group, a part or all of hydrogen atoms included in the monovalent hydrocarbon group; more preferably the alkyl group or the aryl group; still more preferably a methyl group, an ethyl group, or a phenyl group; and particularly preferably a methyl group or an ethyl group.

The substituted or unsubstituted divalent hydrocarbon group having 1 to 20 carbon atoms that bonds to two Si atoms which is represented by $R^3$ is exemplified by a substituted or unsubstituted divalent chain hydrocarbon group having 1 to 20 carbon atoms, a substituted or unsubstituted divalent aliphatic cyclic hydrocarbon group having 3 to 20 carbon atoms, a substituted or unsubstituted divalent aromatic hydrocarbon group having 6 to 20 carbon atoms, and the like.

Examples of the unsubstituted divalent chain hydrocarbon group having 1 to 20 carbon atoms include: chain saturated hydrocarbon groups such as a methanediyl group and an ethanediyl group; chain unsaturated hydrocarbon groups such as an ethenediyl group and a propenediyl group; and the like.

Examples of the unsubstituted divalent aliphatic cyclic hydrocarbon group having 3 to 20 carbon atoms include: monocyclic saturated hydrocarbon groups such as a cyclobutanediyl group; monocyclic unsaturated hydrocarbon groups such as a cyclobutenediyl group; polycyclic saturated hydrocarbon groups such as a bicyclo[2.2.1]heptanediyl group; polycyclic unsaturated hydrocarbon groups such as a bicyclo[2.2.1]heptenediyl group; and the like.

Examples of the unsubstituted divalent aromatic hydrocarbon group having 6 to 20 carbon atoms include a phenylene group, a biphenylene group, a phenyleneethylene group, a napthylene group, and the like.

Examples of a substituent in the substituted divalent hydrocarbon group having 1 to 20 carbon atoms represented by $R^3$ include a halogen atom, a hydroxy group, a cyano group, a nitro group, an alkoxy group, an acyl group, an acyloxy group, and the like.

$R^3$ represents preferably the unsubstituted chain saturated hydrocarbon group or the unsubstituted aromatic hydrocarbon group, and more preferably a methanediyl group, an ethanediyl group, or a phenylene group.

"a" is preferably 1 or 2, and more preferably 1.
b is preferably 0 or 1, and more preferably 0.
c is preferably 1 or 2, and more preferably 1.
d is preferably 0 or 1, and more preferably 0.
p is preferably 2 or 3.

The lower limit of a proportion of the structural unit (I) contained with respect to total structural units constituting the compound (A) is preferably 1 mol %, more preferably 10 mol %, still more preferably 30 mol %, and particularly preferably 50 mol %. The upper limit of the proportion is preferably 99 mol %, more preferably 90 mol %, still more preferably 80 mol %, and particularly preferably 70 mol %. By having the proportion of the structural unit (I) fall within the above range, the storage stability, the collapse-inhibiting property, resistance to etching by an oxygen-based gas, and solvent resistance can be further improved.

Structural Unit (II)

The compound (A) may further have at least one second structural unit (hereinafter, may be also referred to as "structural unit (II)") selected from the group consisting of a structural unit represented by the following formula (2-1), and a structural unit represented by the following formula (2-2).

$$(SiO_{4/2}) \quad (2\text{-}1)$$

$$(R^4_{q/2}SiO_{(4-q)/2}) \quad (2\text{-}2)$$

In the above formula (2-2), $R^4$ represents a substituted or unsubstituted divalent hydrocarbon group having 1 to 20 carbon atoms that bonds to two Si atoms; and q is an integer of 1 to 4, wherein in a case in which q is no less than 2, a plurality of $R^4$s are identical or different.

Examples of the substituted or unsubstituted divalent hydrocarbon group having 1 to 20 carbon atoms that bonds to two Si atoms which is represented by $R^4$ include groups similar to those exemplified as the substituted or unsubstituted divalent hydrocarbon group having 1 to 20 carbon atoms that bonds to two Si atoms which is represented by $R^3$ in the above formula (1-2), and the like.

$R^4$ is preferably the unsubstituted chain saturated hydrocarbon group or the unsubstituted aromatic hydrocarbon group, and more preferably a methanediyl group, an ethanediyl group, or a phenylene group.

q is preferably 2 to 4, and more preferably 3 or 4.

In a case in which the compound (A) has the structural unit (II), the lower limit of a proportion of the structural unit (II) contained with respect to total structural units constituting the compound (A) is preferably 1 mol %, more preferably 5 mol %, still more preferably 10 mol %, and particularly preferably 20 mol %. The upper limit of the proportion is preferably 90 mol %, more preferably 70 mol %, still more preferably 60 mol %, and particularly preferably 50 mol %.

Structural Unit (III)

The compound (A) may further contain at least one third structural unit (hereinafter, may be also referred to as "structural unit (III)") selected from the group consisting of a structural unit represented by the following formula (3-1), and a structural unit represented by the following formula (3-2).

$$\left( \begin{array}{c} (R^5)_e \\ | \\ SiO_{(4-e)/2} \end{array} \right) \quad (3\text{-}1)$$

$$\left( \begin{array}{c} (R^6)_f \\ | \\ R^7_{r/2}SiO_{(4-f-r)/2} \end{array} \right) \quad (3\text{-}2)$$

In the above formula (3-1), $R^5$ represents a hydroxy group, a halogen atom, or a monovalent organic group having 1 to 20 carbon atoms; and e is an integer of 1 to 3, wherein in a case in which e is no less than 2, a plurality of $R^5$s are identical or different.

In the above formula (3-2), $R^6$ represents a hydroxy group, a halogen atom, or a monovalent organic group having 1 to 20 carbon atoms; f is 1 or 2, wherein in a case in which f is 2, two $R^6$s are identical or different; $R^7$ represents a substituted or unsubstituted divalent hydrocarbon group having 1 to 20 carbon atoms that bonds to two Si atoms; and r is an integer of 1 to 3, wherein in a case in which r is no less than 2, a plurality of $R^7$s are identical or different, and wherein a sum of f and r is no greater than 4.

Examples of the monovalent organic group having 1 to 20 carbon atoms which may be represented by $R^5$ or $R^6$ include groups similar to those exemplified as the monovalent organic groups having 1 to 20 carbon atoms which may be represented by $R^1$ in the above formula (1-1), and the like.

$R^5$ and $R^6$ each represent preferably the monovalent chain hydrocarbon group, the monovalent aromatic hydrocarbon group, or the monovalent group obtained by substituting with a monovalent hetero atom-containing group, a part or all of hydrogen atoms included in the monovalent hydrocarbon group; more preferably the alkyl group or the aryl group; still more preferably a methyl group, an ethyl group, or a phenyl group; and particularly preferably a methyl group or an ethyl group.

Examples of the substituted or unsubstituted divalent hydrocarbon group having 1 to 20 carbon atoms that bonds to two Si atoms which is represented by $R^7$ include groups similar to those exemplified as the substituted or unsubstituted divalent hydrocarbon group having 1 to 20 carbon atoms that bonds to two Si atoms which may be represented by $R^3$ in the above formula (1-2), and the like.

$R^7$ is preferably the unsubstituted chain saturated hydrocarbon group or the unsubstituted aromatic hydrocarbon group, and more preferably a methanediyl group, an ethanediyl group, or a phenylene group.

e is preferably 1 or 2, and more preferably 1.

f is preferably 1.

r is preferably 2 or 3.

In a case in which the compound (A) has the structural unit (III), the lower limit of a proportion of the structural unit (III) contained with respect to total structural units constituting the compound (A) is preferably 1 mol %, more preferably 5 mol %, still more preferably 10 mol %, and particularly preferably 20 mol %. The upper limit of the proportion is preferably 90 mol %, more preferably 70 mol %, still more preferably 60 mol %, and particularly preferably 50 mol %.

Other Structural Unit(s)

The other structural unit(s) may be exemplified by a structural unit containing a Si—Si bond, a structural unit containing a Si atom not bonded to an oxygen atom, and the like.

The lower limit of a proportion of the compound (A) with respect to total components in the film-forming composition other than the solvent (C) is preferably 5% by mass, and more preferably 10% by mass. The upper limit of the proportion is preferably 99% by mass, and more preferably 50% by mass.

The compound (A) preferably has a form of a polymer. A "polymer" as referred to herein means a compound having no less than two structural units; in a case in which an identical structural unit repeats twice or more, the structural unit may be also referred to as a "repeating unit." In the case in which the compound (A) has the form of a polymer, the lower limit of a weight average molecular weight (Mw) of the compound (A) is preferably 1,000, more preferably 1,300, still more preferably 1,500, and particularly preferably 1,700. The upper limit of the Mw is preferably 100,000, more preferably 20,000, still more preferably 7,000, and particularly preferably 3,000.

The Mw of the compound (A) herein is a value measured by gel permeation chromatography (GPC; detector: differential refractometer) using GPC columns available from Tosoh Corporation ("G2000 HXL"×2, "G3000 HXL"×1 and "G4000 HXL"×1) under analytical conditions involving a flow rate of 1.0 mL/min, an elution solvent of tetrahydrofuran, and a column temperature of 40° C., with monodispersed polystyrene as a standard.

For example, the compound (A) can be obtained by: carrying out hydrolytic condensation with a polysiloxane having the structural unit (I), a polycarbosilane having the structural unit (I), a silane compound that gives the structural unit (I), a carbosilane compound that gives the structural unit (I), and/or the like, and as necessary other silane compound(s) and/or the like, in a solvent of diisopropyl ether, etc. in the presence of water and a catalyst such as oxalic acid, and preferably subjecting a solution including a thus generated hydrolytic condensation product to purification by solvent substitution or the like in the presence of a dehydrating agent such as molecular sieve(s) or an orthoester. It is believed that by the hydrolytic condensation reaction or the like, hydrolyzable silane monomer(s) is/are incorporated into the compound (A) regardless of a type thereof, and proportions of the structural units (I) to (III) and the other structural unit(s) in the thus synthesized compound (A) will typically be equivalent to proportions of the usage amounts of respective monomer compounds used in the synthesis reaction.

(B) Orthoester

The orthoester (B) is an ester of an orthocarboxylic acid. The orthoester (B) reacts with water to give a carboxylic acid ester or the like. In the film-forming composition, the orthoester (B) may be used alone of one type, or in a combination or two or more types thereof.

The orthoester (B) is exemplified by compounds represented by the following formula (4), and the like.

$$R^8-C(OR^9)_3 \qquad (4)$$

In the above formula (4), $R^8$ represents a hydrogen atom or a substituted or unsubstituted monovalent hydrocarbon group having 1 to 20 carbon atoms; and each $R^9$ independently represents a substituted or unsubstituted monovalent hydrocarbon group having 1 to 20 carbon atoms.

Examples of the substituted or unsubstituted monovalent hydrocarbon group having 1 to 20 carbon atoms which may be represented by $R^8$ include groups obtained by adding one hydrogen atom to the group exemplified as the substituted or unsubstituted divalent hydrocarbon group having 1 to 20 carbon atoms which is represented by $R^3$ in the above formula (1-2), and the like.

$R^8$ represents preferably a hydrogen atom or an unsubstituted hydrocarbon group, more preferably a hydrogen atom or an unsubstituted chain hydrocarbon group, still more preferably a hydrogen atom or an alkyl group, and particularly preferably a hydrogen atom or a methyl group.

Examples of the substituted or unsubstituted monovalent hydrocarbon group having 1 to 20 carbon atoms which is represented by $R^9$ include groups obtained by adding one hydrogen atom to the group exemplified as the substituted or unsubstituted divalent hydrocarbon group having 1 to 20 carbon atoms which is represented by $R^3$ in the above formula (1-2), and the like. Of these, $R^9$ represents preferably an unsubstituted hydrocarbon group, more preferably an unsubstituted chain hydrocarbon group, still more preferably an alkyl group, and particularly preferably a methyl group or an ethyl group.

Examples of the orthoester (B) include: orthoformic acid esters such as methyl orthoformate, ethyl orthoformate, and propyl orthoformate; orthoacetic acid esters such as methyl orthoacetate, ethyl orthoacetate, and propyl orthoacetate; orthopropionic acid esters such as methyl orthopropionate, ethyl orthopropionate, and propyl orthopropionate; and the like. Of these, the orthoester (B) is preferably the orthoformic acid ester or the orthoacetic acid ester, and more preferably methyl orthoformate, ethyl orthoformate, methyl orthoacetate, or ethyl orthoacetate.

The lower limit of a content of the orthoester (B) with respect to 100 parts by mass of the compound (A) is preferably 10 parts by mass, more preferably 100 parts by mass, and still more preferably 300 parts by mass. The upper limit of the content is preferably 10,000 parts by mass, more preferably 5,000 parts by mass, still more preferably 2,000 parts by mass, and particularly preferably 1,000 parts by mass. When the content of the orthoester (B) falls within the above range, the storage stability of the film-forming composition can be further improved.

(C) Solvent

The film-forming composition usually contains the solvent (C). The solvent (C) is exemplified by an alcohol solvent, a ketone solvent, an ether solvent, an ester solvent, a nitrogen-containing solvent, water, and the like. The solvent (C) may be used either alone of one type, or in a combination of two or more types thereof.

Examples of the alcohol solvent include: monohydric alcohol solvents such as methanol, ethanol, n-propanol, iso-propanol, n-butanol, and iso-butanol; polyhydric alcohol solvents such as ethylene glycol, 1,2-propylene glycol, diethylene glycol, and dipropylene glycol; and the like.

Examples of the ketone solvent include acetone, methyl ethyl ketone, methyl n-propyl ketone, methyl iso-butyl ketone, cyclohexanone, and the like.

Examples of the ether solvent include ethyl ether, isopropyl ether, ethylene glycol dibutyl ether, diethylene glycol monomethyl ether, diethylene glycol monoethyl ether, diethylene glycol diethyl ether, propylene glycol monomethyl ether, propylene glycol monoethyl ether, propylene glycol monopropyl ether, tetrahydrofuran, and the like.

Examples of the ester solvent include ethyl acetate, γ-butyrolactone, n-butyl acetate, ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, dipropylene glycol monomethyl ether acetate, dipropylene glycol monoethyl ether acetate, ethyl propionate, n-butyl propionate, methyl lactate, ethyl lactate, and the like.

Examples of the nitrogen-containing solvent include N,N-dimethylformamide, N,N-dimethylacetamide, N-methylpyrrolidone, and the like.

Of these, the ether solvent or the ester solvent is preferred, and due to superiority in film formability, the ether solvent having a glycol structure or the ester solvent having a glycol structure is more preferred.

Examples of the ether solvent having a glycol structure and the ester solvent having a glycol structure include propylene glycol monomethyl ether, propylene glycol monoethyl ether, propylene glycol monopropyl ether, propylene glycol monomethyl ether acetate, propylene glycol monoethyl ether acetate, propylene glycol monopropyl ether acetate, and the like. Of these, in particular, propylene glycol monomethyl ether acetate is preferred.

A percentage content of the ether solvent having a glycol structure and the ester solvent having a glycol structure in the solvent (C) is preferably 20% by mass, more preferably 60% by mass, still more preferably 90% by mass, and particularly preferably 100% by mass.

In the case in which the film-forming composition contains the solvent (C), the lower limit of a percentage content of the solvent (C) in the film-forming composition is preferably 50% by mass, more preferably 80% by mass, still more preferably 90% by mass, and particularly preferably 95% by mass. The upper limit of the percentage content is preferably 99.9% by mass, and more preferably 99% by mass.

Other Optional Component(s)

The other optional component(s) is/are exemplified by an acid generating agent, a basic compound (including a base generator), a radical generating agent, a surfactant, colloidal silica, colloidal alumina, an organic polymer, and the like. The other optional component(s) may be used alone of one type, or in a combination or two or more types thereof.

Acid Generating Agent

The acid generating agent is a component which generates an acid upon exposure or heating. When the film-forming composition contains the acid generating agent, the condensation reaction of the compound (A) can be promoted even at a relatively low temperature (including room temperature).

Examples of the acid generating agent capable of generating an acid upon exposure (hereinafter, may be also referred to as "photo acid generating agent") include acid generating agents disclosed in paragraphs [0077] to [0081] of Japanese Unexamined Patent Application, Publication No. 2004-168748, and the like.

Moreover, examples of the acid generating agent which generates an acid upon heating (hereinafter, may be also referred to as "thermal acid generating agent") include onium salt-type acid generating agents exemplified as the photo acid generating agent in the above-mentioned patent document, as well as 2,4,4,6-tetrabromocyclohexadienone, benzoin tosylate, 2-nitrobenzyl tosylate, alkyl sulfonates, and the like.

In the case in which the film-forming composition contains the acid generating agent, the lower limit of a content of the acid generating agent with respect to 100 parts by mass of the compound (A) is preferably 20 parts by mass, and more preferably 10 parts by mass.

Basic Compound

The basic compound promotes a hardening reaction of the film-forming composition, and consequently, the strength and the like of the film to be formed can be improved. In addition, the basic compound improves peelability of the film by an acidic liquid. The basic compound is exemplified by: a compound having a basic amino group; a base generating agent that is capable of generating a compound having a basic amino group by an action of an acid or an action of heat; and the like. Exemplary compounds having a basic amino group include amine compounds and the like. Exemplary base generating agents include an amide group-containing compound, a urea compound, a nitrogen-containing heterocyclic compound, and the like. Specific examples of the amine compound, the amide group-containing compound, the urea compound, and the nitrogen-containing heterocyclic compound include compounds disclosed in paragraphs [0079] to [0082] of Japanese Unexamined Patent Application, Publication No. 2016-27370, and the like.

In the case in which the film-forming composition contains the basic compound, a content of the basic compound with respect to 100 parts by mass of the compound (A) is, for example, no less than 1 part by mass and no greater than 50 parts by mass.

In the case in which the film-forming composition contains the surfactant, the colloidal silica, the colloidal alumina, and/or the organic polymer, the upper limit of a content of each one of these components with respect to 100 parts by mass of the compound (A) is preferably 20 parts by mass, and more preferably 10 parts by mass.

Preparation Procedure of Film-Forming Composition

A preparation procedure of the film-forming composition is not particularly limited, and the film-forming composition may be prepared by, for example, mixing at a predetermined ratio, a solution of the compound (A), the orthoester (B), the solvent (C), and the other optional component(s) that is/are to be used as needed, and preferably filtering a resulting mixture through a filter having a pore size of no greater than 0.2 µm.

Silicon-Containing Film

The silicon-containing film of the one embodiment of the present invention is formed from the film-forming composition of the one embodiment of the present invention. Due to being obtained from the film-forming composition described above, the silicon-containing film is superior in resolution, the collapse-inhibiting property, and resistance to etching by an oxygen-based gas.

Resist Pattern-Forming Method

The resist pattern-forming method of the one embodiment of the present invention includes: a step of applying a film-forming composition for a semiconductor lithography process directly or indirectly on at least an upper face of a substrate (hereinafter, may be also referred to as "applying step (1)"); a step of applying a resist composition on an upper face of a silicon-containing film formed by the applying step (1) (hereinafter, may be also referred to as "applying step (2)"); a step of exposing a resist film formed by the applying step (2) (hereinafter, may be also referred to as "exposing step"); and a step of developing the resist film exposed (hereinafter, may be also referred to as "developing step"), wherein the film-forming composition contains: a compound having a Si—H bond; and an orthoester. In the resist pattern-forming method of the one embodiment of the present invention, the film-forming composition of the one embodiment of the present invention, described above, is used as the film-forming composition for a semiconductor lithography process.

Due to using the film-forming composition of the one embodiment of the present invention, the resist pattern-forming method of the one embodiment of the present invention enables formation of a silicon-containing film with the resolution, the collapse-inhibiting property, and resistance to etching by an oxygen-based gas each being superior.

The resist pattern-forming method may include, as necessary, other step(s) such as, for example, a step of carrying out etching following the developing step (hereinafter, may be also referred to as "etching step"); a step of forming an organic underlayer film directly or indirectly on at least an upper face of the substrate before the applying step (1) (hereinafter, may be also referred to as "organic underlayer film-forming step"); and the like. Hereinafter, each step will be described.

Organic Underlayer Film-Forming Step

In this step, the organic underlayer film is formed directly or indirectly on an upper face of the substrate.

In the case of carrying out the organic underlayer film-forming step in the resist pattern-forming method, the applying step (1), described later, is carried out following the organic underlayer film-forming step. In such a case, in the applying step (1), the silicon-containing film is formed by applying the film-forming composition on an upper face of the organic underlayer film.

The substrate is exemplified by insulating films of a silicon oxide, a silicon nitride, a silicon oxynitride, a polysiloxane, or the like; resin substrates; and the like.

The organic underlayer film is different from the silicon-containing film formed from the film-forming composition described above. The organic underlayer film serves in further compensating, in pattern formation, for a function exhibited by the resist film, the silicon-containing film formed from the film composition, and the like, as well as in imparting necessary certain function(s)(for example, an antireflective property, coating film flatness, and high etching resistance to a fluorine-based gas) for attaining the function(s) not exhibited by the silicon-containing film, the resist film, and the like.

The organic underlayer film is exemplified by an antireflective film and the like. An exemplary antireflective film-forming composition may include "NFC HM8006," available from JSR Corporation, and the like.

The organic underlayer film may be formed by, for example, applying an organic underlayer film-forming composition by spin coating or the like to form a coating film, and then heating.

Applying Step (1)

In this step, the film-forming composition is applied directly or indirectly on an upper face of the substrate. By this step, a coating film of the film-forming composition is formed on the substrate directly or via another layer such as the organic underlayer film. A procedure for applying the film-forming composition is not particularly limited, and for example, a well-known procedure such as, e.g., spin-coating may be exemplified.

The silicon-containing film is formed by, for example, subjecting the coating film formed by applying the film-forming composition on the substrate or the like to, typically, exposure and/or heating, thereby allowing for hardening.

Examples of the exposure light which may be used for the exposure include: electromagnetic waves such as a visible light ray, an ultraviolet ray, a far ultraviolet ray, an X-ray, and a γ-ray; particle rays such as an electron beam, a molecular beam, and an ion beam; and the like.

The lower limit of a temperature when heating the coating film is preferably 90° C., more preferably 150° C., and still more preferably 200° C. The upper limit of the temperature is preferably 550° C., more preferably 450° C., and still more preferably 300° C. The lower limit of an average thickness of the silicon-containing film formed is preferably 1 nm, more preferably 3 nm, and still more preferably 5 nm. The upper limit of the average thickness is preferably 100 nm, more preferably 50 nm, and still more preferably 30 nm.

Applying Step (2)

In this step, the resist composition is applied on an upper face of the silicon-containing film formed by the applying step (1). In this step, the resist film is formed on the upper face of the silicon-containing film formed by the applying step (1), or the like.

The resist composition is exemplified by: a radiation-sensitive resin composition (chemically amplified resist composition) containing a polymer having an acid-labile group and a radiation-sensitive acid generating agent; a positive-tone resist composition containing an alkali-soluble resin and a quinone diazide-based photosensitizing agent; a negative-tone resist composition containing an alkali-soluble resin and a crosslinking agent; and the like. In a case in which the radiation-sensitive resin composition is used, formation of a positive-tone pattern is enabled by developing with an alkaline developer solution, whereas formation of a negative-tone pattern is enabled by developing with an organic solvent developer solution.

The polymer contained in the radiation-sensitive resin composition may have, in addition to a structural unit that includes the acid-labile group, for example, a structural unit that includes a lactone structure, a cyclic carbonate structure, and/or a sultone structure; a structural unit that includes an alcoholic hydroxyl group; a structural unit that includes a phenolic hydroxyl group; a structural unit that includes a fluorine atom; and/or the like. When the polymer has the structural unit that includes a phenolic hydroxyl group and/or the structural unit that includes a fluorine atom, an improvement in sensitivity is enabled in the case of using an extreme ultraviolet ray as the radioactive ray in the exposure.

A procedure for applying the resist composition may be exemplified by, e.g., spin coating or the like.

Exposing Step

In this step, the resist film formed by the applying step (2) is exposed. The exposure may be carried out by selectively irradiating with a radioactive ray by using, for example, a photomask or a reflective mask.

Examples of the exposure light which may be used in the exposing step include: electromagnetic waves such as a visible light ray, an ultraviolet ray, a far ultraviolet ray, an X-ray, and a γ-ray; particle rays such as an electron beam, a molecular beam, and an ion beam; and the like. Of these, the far ultraviolet ray or the electron beam is preferred, an extreme ultraviolet ray (EUV) or the electron beam is more preferred, and the EUV is still more preferred.

Developing Step

In this step, the resist film exposed is developed. The development may be either development with an alkali, or development with an organic solvent. In the case of the development with an alkali, examples of a developer solution include basic aqueous solutions of tetramethyl ammonium hydroxide (TMAH), tetraethyl ammonium hydroxide, or the like. In the case of the development with an organic solvent, examples of a developer solution include organic solvents such as n-butyl acetate, iso-butyl acetate, sec-butyl acetate, and amyl acetate, and the like.

Development with the above developer solution is followed by washing and drying, whereby a predetermined resist pattern is formed.

Etching Step

In this step, etching is conducted. In this step, typically, the substrate is etched using the aforementioned resist pattern as a mask to form a pattern on the substrate. The etching may be carried out once or multiple times. In other words, the etching may be conducted sequentially with patterns obtained by the etching as masks. In the case in which the etching is conducted multiple times, the silicon-containing film, the resist underlayer film, and the substrate are subjected to the etching sequentially in this order. The etching procedure may be exemplified by dry etching, wet etching, and the like. After the etching, the substrate having a predetermined pattern can be obtained.

The dry etching may be carried out by using, for example, a known dry etching apparatus. An etching gas to be used for the dry etching may be appropriately selected depending on element composition and the like of the film to be etched. Examples of the etching gas which may be used include: fluorine-based gases such as $CHF_3$, $CF_4$, $C_2F_6$, $C_3F$, and $SF_6$; chlorine-based gases such as $Cl_2$ and $BCl_3$; oxygen-based gases such as $O_2$, $O_3$, and $H_2O$; reductive gases such as $H_2$, $NH_3$, CO, $CH_4$, $C_2H_2$, $C_2H_4$, $C_2H_4$, $C_3H_4$, $C_3H_6$, $C_3H_8$, HF, HI, HBr, HCl, NO, $NH_3$, and $BCl_3$; inert gases such as He, $N_2$, and Ar; and the like. These gases may be used as a mixture. In dry etching of the silicon-containing film, the fluorine-base gas is typically used. In dry etching of the organic underlayer film using the silicon-containing film as a mask, the oxygen-based gas is typically used. In dry etching of the substrate, the fluorine-based based is typically used.

EXAMPLES

Examples of the present invention will be demonstrated below. It is to be noted that each of the following Examples merely illustrates one typical example of the present invention, and the scope of the present invention should not be construed to be narrowed by the Examples.

In the Examples, the weight average molecular weights (Mw) of the polycarbosilane and the compound (A); a concentration of the solution of the compound (A); and an average thickness of the film were measured according to the following procedures.

Weight Average Molecular Weight (Mw)

The weight average molecular weights (Mw) of the polycarbosilane and the compound (A) were measured by gel permeation chromatography (GPC) using GPC columns available from Tosoh Corporation ("G2000 HXL"×2, "G3000 HXL"×1, and "G4000 HXL"×1) under the following analytical conditions.

elution solvent: tetrahydrofuran (Wako Pure Chemical Industries, Ltd.)
flow rate: 1.0 mL/min
sample concentration: 1.0% by mass
amount of injected sample: 100 μL
column temperature: 40° C.
detector: differential refractometer
standard substance: mono-dispersed polystyrene Concentration of Solution of (A) Compound The concentration (% by mass) of the solution of the compound (A) was determined by: baking 0.5 g of the solution of the compound (A) at 250° C. for 30 min; measuring a mass of a residue thus obtained; and dividing the mass of the residue by the mass of the solution of the compound (A).

Average Thickness of Film

The average thickness of the film was measured by using a spectroscopic ellipsometer ("M2000D," available from J. A. Woollam).

Synthesis of (A) Compound

Monomers used for syntheses in the Examples are presented below.

(H-1)

(H-2)

(H-3)

(S-1)

(S-2)

-continued

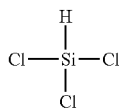
(S-3)

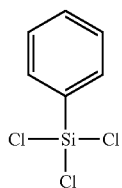
(S-4)

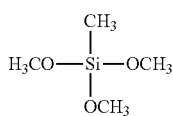
(S-5)

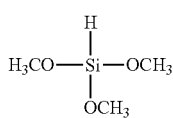
(S-6)

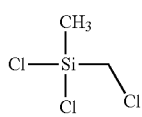
(S-7)

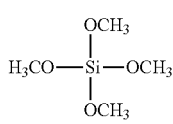
(M-1)

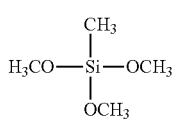
(M-2)

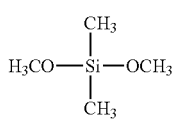
(M-3)

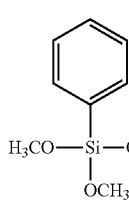
(M-4)

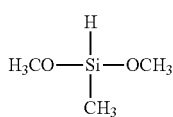
(M-5)

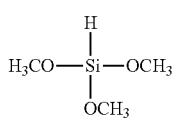
(M-6)

"mol %" in the following Synthesis Examples 11 to 28 means a value, provided that a total mol number of Si atoms in the polycarbosilane and the monomers used was 100 mol %.

Synthesis of Polycarbosilane

Synthesis Example 1: Synthesis of Polycarbosilane (a-1)

Into a nitrogen-substituted reaction vessel, 18.61 g of magnesium and 35 g of tetrahydrofuran were charged, and the mixture was stirred at 20° C. Next, 55.45 g of a compound represented by the above formula (H-1), 14.30 g of a compound represented by the above formula (S-2), and 30.24 g of a compound represented by the above formula (S-3)(molar ratio: 50/15/35 (mol %)) were dissolved in 355 g of tetrahydrofuran to prepare a monomer solution. The internal temperature of the reaction vessel was adjusted to 20° C., and the monomer solution was added dropwise thereto over 1 hr with stirring. A time point of completion of the dropwise addition was defined as a start time of the reaction, and the reaction was allowed at 40° C. for 1 hr, and then at 60° C. for 3 hrs. After completion of the reaction, 213 g of tetrahydrofuran was added thereto, and the mixture was cooled to no greater than 10° C. to give a polymerization reaction liquid. Next, 96.84 g of triethylamine was added to the polymerization reaction liquid, and then 30.66 g of methanol was added dropwise over 10 min with stirring. A time point of completion of the dropwise addition was defined as a start time of the reaction, and the reaction was allowed at 20° C. for 1 hr. The reaction liquid was charged into 700 g of diisopropyl ether, and a salt thus precipitated was filtered out. Next, tetrahydrofuran, excess triethylamine, and excess methanol in the filtrate were removed by using an evaporator. A thus resulting residue was charged into 180 g of diisopropyl ether, and a salt thus precipitated was filtered out. An addition of diisopropyl ether to the filtrate gave 223 g of a solution of polycarbosilane (a-1) in diisopropyl ether. The Mw of the polycarbosilane (a-1) was 700.

Synthesis Examples 2 to 6 and 8 to 10: Syntheses of Polycarbosilanes (a-2) to (a-6) and (a-8) to (a-10)

Solutions of polycarbosilanes (a-2) to (a-6) and (a-8) to (a-10) in diisopropyl ether were obtained similarly to Synthesis Example 1 except that each monomer of the type and in the amount shown in Table 1 below was used. The weight average molecular weights (Mw) of the polycarbosilanes thus obtained are shown together in Table 1. In Table 1, "-" indicates that the corresponding monomer was not used.

Synthesis Example 7: Synthesis of Polycarbosilane (a-7)

Into a nitrogen-substituted reaction vessel, 18.40 g of magnesium, 2.94 g of lithium chloride, and 35 g of tetrahydrofuran were charged, and the mixture was stirred at 20° C. Next, 54.85 g of a compound represented by the above formula (H-1), 5.36 g of a compound represented by the above formula (S-1), 14.15 g of a compound represented by the above formula (S-2), and 25.64 g of a compound represented by the above formula (S-3)(molar ratio: 50/5/15/305 (mol %)) were dissolved in 351 g of tetrahydrofuran to prepare a monomer solution. The internal temperature of the reaction vessel was adjusted to 20° C., and the monomer solution was added dropwise thereto over 1 hr with stirring. A time point of completion of the dropwise addition was defined as a start time of the reaction, and the reaction was allowed at 40° C. for 1 hr, and then at 60° C. for 3 hrs. After completion of the reaction, 210 g of tetrahydrofuran was added thereto, and the mixture was cooled to no greater than 10° C. to give a polymerization reaction solution. Next, 95.78 g of triethylamine was added, and then 30.33 g of methanol was added dropwise over 10 min with stirring. A time point of completion of the dropwise addition was defined as a start time of the reaction, and the reaction was allowed at 20° C. for 1 hr. The reaction liquid was charged into 700 g of diisopropyl ether, and a salt thus precipitated was filtered out. Tetrahydrofuran, excess triethylamine, and excess methanol in the filtrate were removed by using an evaporator. A residue thus obtained was charged into 180 g of diisopropyl ether, and a salt thus precipitated was filtered out. An addition of diisopropyl ether to the filtrate gave 199 g of a solution of polycarbosilane (a-7) in diisopropyl ether. The Mw of the polycarbosilane (a-7) was 1,100.

monomethyl ether acetate, and then esters and alcohols produced by the reaction, trimethyl orthoformate, and excess propylene glycol monomethyl ether acetate were removed by using an evaporator to give a solution of the compound (A-1) in propylene glycol monomethyl ether acetate. The Mw of the compound (A-1) was 2,500. The concentration of the solution of the compound (A-1) in propylene glycol monomethyl ether acetate was 5% by mass.

Synthesis Examples 13, 19, and 21: Syntheses of Compounds (A-3), (A-9), and (A-11)

Propylene glycol monomethyl ether acetate solutions of compounds (A-3), (A-9), and (A-11) were obtained similarly to Synthesis Example 11 except that each polycarbosilane and monomer of the type and in the amount shown in Table 2 below, and each dehydrating agent of the type shown in Table 2 below, were used. "-" in columns of the monomers in Table 2 indicates that the corresponding monomer was not used. The concentration of the solution of the compound (A) thus obtained, and the Mw of the compound (A) are shown together in Table 2.

TABLE 1

| | Polycarbo- | Amount of each monomer charged (mol %) | | | | | | | | | | |
|---|---|---|---|---|---|---|---|---|---|---|---|---|
| | silane | H-1 | H-2 | H-3 | S-1 | S-2 | S-3 | S-4 | S-5 | S-6 | S-7 | Mw |
| Synthesis Example 1 | a-1 | 50 | — | — | — | 15 | 35 | — | — | — | — | 700 |
| Synthesis Example 2 | a-2 | 50 | — | — | 5 | 15 | 30 | — | — | — | — | 800 |
| Synthesis Example 3 | a-3 | 40 | — | 5 | 10 | 15 | 30 | — | — | — | — | 700 |
| Synthesis Example 4 | a-4 | — | 55 | — | 5 | — | 40 | — | — | — | — | 900 |
| Synthesis Example 5 | a-5 | — | — | 50 | 20 | — | 30 | — | — | — | — | 800 |
| Synthesis Example 6 | a-6 | 55 | — | — | 10 | — | 30 | 5 | — | — | — | 700 |
| Synthesis Example 7 | a-7 | 50 | — | — | 5 | 15 | 30 | — | — | — | — | 1,100 |
| Synthesis Example 8 | a-8 | 50 | — | — | — | — | — | — | 10 | 40 | — | 600 |
| Synthesis Example 9 | a-9 | — | 40 | — | — | — | 30 | — | — | — | 30 | 900 |
| Synthesis Example 10 | a-10 | 50 | — | — | 20 | 30 | — | — | — | — | — | 900 |

Synthesis of (A) Compound

Synthesis Example 11: Synthesis of Compound (A-1)

Into a reaction vessel, 100 g of the 223 g solution of the polycarbosilane (a-1) in diisopropyl ether obtained in Synthesis Example 1, and 90 g of methanol were charged. The internal temperature of the reaction vessel was adjusted to 30° C., and 8 g of a 3.2% by mass aqueous oxalic acid solution was added dropwise thereto over 20 min with stirring. A time point of completion of the dropwise addition was defined as a start time of the reaction, and the reaction was allowed at 40° C. for 4 hrs. After completion of the reaction, the internal temperature of the reaction vessel was cooled to no greater than 30° C. Next, to the reaction vessel were added 99 g of diisopropyl ether and 198 g of water, and after liquid separation extraction was conducted, to an organic layer thus obtained were added 0.26 g of oxalic acid dihydrate and 396 g of propylene glycol monomethyl ether acetate. Then water, diisopropyl ether, alcohols produced by the reaction, and excess propylene glycol monomethyl ether acetate were removed by using an evaporator. Next, to a solution thus obtained was added 19.82 g of trimethyl orthoformate as a dehydrating agent, and after the reaction was allowed at 40° C. for 1 hr, the internal temperature of the reaction vessel was cooled to no greater than 30° C. To the reaction vessel was added 99 g of propylene glycol Synthesis Example 12: Synthesis of Compound (A-2)

In a reaction vessel, 100 g of the 223 g solution of the polycarbosilane (a-1) in diisopropyl ether obtained in Synthesis Example 1, and 4.88 g of the compound represented by the above formula (M-2) (20 mol % with respect to 80 mol % polycarbosilane (a-1)) were dissolved in 139 g of methanol. The internal temperature of the reaction vessel was adjusted to 30° C., and 14 g of a 3.2% by mass aqueous oxalic acid solution was added dropwise thereto over 20 min with stirring. A time point of completion of the dropwise addition was defined as a start time of the reaction, and the reaction was allowed at 40° C. for 4 hrs. The internal temperature of the reaction vessel was cooled to no greater than 30° C. Next, to the reaction vessel were added 129 g of diisopropyl ether and 258 g of water, and after liquid separation extraction was conducted, 0.45 g of oxalic acid dihydrate and 516 g of propylene glycol monomethyl ether acetate were added thereto. Then water, diisopropyl ether, alcohols generated by the reaction, and excess propylene glycol monomethyl ether acetate were removed by using an evaporator. To a solution thus obtained was added 25.83 g of trimethyl orthoformate as a dehydrating agent, and after the reaction was allowed at 40° C. for 1 hr, the temperature was cooled to no greater than 30° C. Next, 129 g of propylene glycol monomethyl ether acetate was added thereto, and then esters and alcohols produced by the reaction, trimethyl orthoformate, and excess propylene glycol monomethyl ether acetate were removed by using an evaporator to give a solution of the compound (A-2) in propylene glycol monomethyl ether acetate. The Mw of the compound (A-2) was 1,800. The concentration of the solution of the compound (A-2) in propylene glycol monomethyl ether acetate was 5% by mass.

Synthesis Examples 14, 15, 17, 18, 20, 22, 23, and 24: Syntheses of Compounds (A-4), A-5), (A-7), (A-8), (A-10), (A-12), (A-13), and (A-14)

Solutions of compounds (A-4), (A-5), (A-7), (A-8), (A-10), (A-12), (A-13), and (A-14) in propylene glycol monomethyl ether acetate were obtained similarly to Synthesis Example 12 except that each polycarbosilane and monomer of the type and in the amount shown in Table 2 below, and each dehydrating agent of the type shown in Table 2 below, were used. The concentration of the solution of the compound (A) thus obtained, and the Mw of the compound (A) are shown together in Table 2.

Synthesis Example 16: Synthesis of Compound (A-6)

In a reaction vessel, 11.63 g of tetramethyl ammonium hydroxide (TMAH) was dissolved in 34.89 g of water. Next, 100 g of the 223 g solution of the polycarbosilane (a-3) in diisopropyl ether obtained in Synthesis Example 3, and 4.88 g of the compound represented by the above formula (M-2) (20 mol % with respect to 80 mol % polycarbosilane (a-3)) were dissolved in 123 g of methanol to prepare a solution for dropwise addition. The internal temperature of the reaction vessel was adjusted to 40° C., and the solution was added dropwise thereto over 1 hr with stirring. A time point of completion of the dropwise addition was defined as a start time of the reaction, and the reaction was allowed at 60° C. for 3 hrs. Thereafter, a polymerization reaction liquid was obtained by cooling to no greater than 30° C. Next, to an aqueous maleic acid solution in which 15.01 g of maleic anhydride was dissolved in 309 g of water, 254 g of n-butanol was added, and after cooling to no greater than 10° C., the polymerization reaction liquid was added dropwise over 60 min with stirring, and thereafter, an aqueous layer was removed using a separatory funnel. After 254 g of water was added and separation extraction was conducted, 254 g of propylene glycol monomethyl ether acetate was added thereto. Then water, diisopropyl ether, and n-butanol were removed by using an evaporator. To a solution thus obtained was added 22.99 g of trimethyl orthoformate as a dehydrating agent, and after a reaction was allowed at 40° C. for 1 hr, the temperature was cooled to no greater than 30° C. Next, 115 g of propylene glycol monomethyl ether acetate was added thereto, and then esters and alcohols produced by the reaction, trimethyl orthoformate, and excess propylene glycol monomethyl ether acetate were removed by using an evaporator to give a solution of the compound (A-6) in propylene glycol monomethyl ether acetate. The Mw of the compound (A-6) was 3,400. The concentration of the solution of the compound (A-6) in the propylene glycol monomethyl ether acetate was 5% by mass.

Synthesis Example 25: Synthesis of Compound (A-15)

In a reaction vessel, 63.31 g of a compound represented by the above formula (M-1), 13.75 g of a compound represented by the above formula (M-4), and 25.41 g of a compound represented by the above formula (M-6) (molar ratio: 60/10/30 (mol %)) were dissolved in 129 g of methanol to prepare a monomer solution. The internal temperature of the reaction vessel was adjusted to 60° C., and 49 g of a 9.1% by mass aqueous oxalic acid solution was added dropwise thereto over 20 min with stirring. A time point of completion of the dropwise addition was defined as a start time of the reaction, and after the reaction was allowed for 4 hrs, the temperature was cooled to no greater than 30° C. To the reaction vessel was added 519 g of propylene glycol monomethyl ether acetate, and then water, alcohols produced by the reaction, and excess propylene glycol monomethyl ether acetate were removed by using an evaporator. To a solution thus obtained was added 22.49 g of trimethyl orthoformate as a dehydrating agent, and after the reaction was allowed at 40° C. for 1 hr, the temperature was cooled to no greater than 30° C. Next, 157 g of propylene glycol monomethyl ether acetate was added thereto, and then esters and alcohols produced by the reaction, trimethyl orthoformate, and excess propylene glycol monomethyl ether acetate were removed by using an evaporator to give a solution of the compound (A-15) in propylene glycol monomethyl ether acetate. The Mw of the compound (A-15) was 1,900. The concentration of the solution of the compound (A-15) in the propylene glycol monomethyl ether acetate was 5% by mass.

Synthesis Example 26: Synthesis of Compound (A-16)

A solution of compound (A-16) in propylene glycol monomethyl ether acetate was obtained similarly to Synthesis Example 25 except that each monomer of the type and in the amount shown in Table 2 below, and the dehydrating agent of the type shown in Table 2 below, were used. The concentration of the solution of the compound (A) thus obtained, and the Mw of the compound (A) are shown together in Table 2.

Synthesis Example 27: Synthesis of Compound (A-17)

In a reaction vessel, 64.74 g of a compound represented by the above formula (M-1), 22.28 g of a compound represented by the above formula (M-2), and 12.97 g of a compound represented by the above formula (M-4) (molar ratio: 65/25/10 (mol %)) were dissolved in 134 g of methanol to prepare a monomer solution. The internal temperature of the reaction vessel was adjusted to 60° C., and 47 g of a 9.1% by mass aqueous oxalic acid solution was added dropwise thereto over 20 min with stirring. A time point of completion of the dropwise addition was defined as a start time of the reaction, and after the reaction was allowed for 4 hrs, the temperature was cooled to no greater than 30° C. To the reaction vessel was added 519 g of propylene glycol monomethyl ether acetate, and then water, alcohols produced by the reaction, and excess propylene glycol monomethyl ether acetate were removed by using an evaporator to give a solution of the compound (A-17) in propylene glycol monomethyl ether acetate. The Mw of the compound (A-17) was 1,900. The concentration of the solution of the compound (A-17) in the propylene glycol monomethyl ether acetate was 5% by mass. "-" in the column of the dehydrating agent in Table 2 indicates that the corresponding dehydrating agent was not used in synthesis of the compound (A-17).

Synthesis Example 28: Synthesis of Compound (A-18)

In a reaction vessel, 84 g of the 146 g solution of the polycarbosilane (a-10) in diisopropyl ether obtained in Synthesis Example 10, and the compound represented by the above formula (M-1) in a proportion of 20 mol % were dissolved in 101 g of methanol. The internal temperature of the reaction vessel was adjusted to 30° C., and 12 g of a 3.2% by mass aqueous oxalic acid solution was added dropwise thereto over 20 min with stirring. A time point of completion of the dropwise addition was defined as a start time of the reaction, and the reaction was allowed at 40° C. for 4 hrs. The internal temperature of the reaction vessel was cooled to no greater than 30° C. Next, 100 g of diisopropyl ether and 200 g of water were added thereto, and after liquid separation extraction was conducted, 0.39 g of oxalic acid dihydrate and 400 g of propylene glycol monomethyl ether acetate were added thereto. Then water, diisopropyl ether, alcohols generated by the reaction, and excess propylene glycol monomethyl ether acetate were removed by using an evaporator to give a solution of the compound (A-18) in propylene glycol monomethyl ether acetate. The Mw of the compound (A-18) was 1,800. The concentration of the solution of the compound (A-18) in the propylene glycol monomethyl ether acetate was 5% by mass. "-" in the column of the dehydrating agent in Table 2 indicates that the corresponding dehydrating agent was not used in synthesis of the compound (A-18).

Synthesis Example 29: Synthesis of Compound (A-19)

Into a reaction vessel, 100 g of the 223 g solution of the polycarbosilane (a-1) in diisopropyl ether obtained in Synthesis Example 1, and 90 g of methanol were charged. The internal temperature of the reaction vessel was adjusted to 30° C., and 8 g of a 3.2% by mass aqueous oxalic acid solution was added dropwise thereto over 20 min with stirring. A time point of completion of the dropwise addition was defined as a start time of the reaction, and the reaction was allowed at 40° C. for 4 hrs. The internal temperature of the reaction vessel was cooled to no greater than 30° C. Next, 99 g of diisopropyl ether and 198 g of water were added thereto, and after liquid separation extraction was conducted, to an organic layer thus obtained were added 0.26 g of oxalic acid dihydrate and 396 g of propylene glycol monomethyl ether acetate. Then water, alcohols generated by the reaction, and excess propylene glycol monomethyl ether acetate were removed by using an evaporator. Next, to a solution thus obtained was added 19.82 g of 3 A molecular sieves as a dehydrating agent, and a dehydrating treatment was conducted at 23° C. for 24 hrs. Thereafter, the 3 A molecular sieves were removed by filtration to give a solution of the compound (A-19) in propylene glycol monomethyl ether acetate. The Mw of the compound (A-19) was 2,500. The concentration of the solution of the compound (A-19) in propylene glycol monomethyl ether acetate was 5% by mass.

TABLE 2

| | (A) Compound | Amount of polycarbosilane and monomer charged (Si mol %) | | | | | | | Dehydrating agent | Concentration (% mass) | Mw |
|---|---|---|---|---|---|---|---|---|---|---|---|
| | | polycarbosilane | M-1 | M-2 | M-3 | M-4 | M-5 | M-6 | | | |
| Synthesis Example 11 | A-1 | a-1 | 100 | — | — | — | — | — | — | trimethyl orthoformate | 5 | 2,500 |
| Synthesis Example 12 | A-2 | a-1 | 80 | — | 20 | — | — | — | — | trimethyl orthoformate | 5 | 1,800 |
| Synthesis Example 13 | A-3 | a-2 | 100 | — | — | — | — | — | — | trimethyl orthoformate | 5 | 2,100 |
| Synthesis Example 14 | A-4 | a-2 | 80 | — | 10 | — | 10 | — | — | trimethyl orthoformate | 5 | 1,300 |
| Synthesis Example 15 | A-5 | a-3 | 90 | 10 | — | — | — | — | — | trimethyl orthoformate | 5 | 1,800 |
| Synthesis Example 16 | A-6 | a-3 | 80 | — | 20 | — | — | — | — | trimethyl orthoformate | 5 | 3,400 |
| Synthesis Example 17 | A-7 | a-4 | 80 | 15 | 5 | — | — | — | — | trimethyl orthoformate | 5 | 2,300 |
| Synthesis Example 18 | A-8 | a-5 | 50 | 45 | — | — | 5 | — | — | trimethyl orthoformate | 5 | 1,900 |
| Synthesis Example 19 | A-9 | a-6 | 100 | — | — | — | — | — | — | trimethyl orthoformate | 5 | 2,200 |
| Synthesis Example 20 | A-10 | a-7 | 80 | — | 20 | — | — | — | — | trimethyl orthoformate | 5 | 2,600 |
| Synthesis Example 21 | A-11 | a-7 | 100 | — | — | — | — | — | — | trimethyl orthoformate | 5 | 1,700 |
| Synthesis Example 22 | A-12 | a-8 | 65 | — | 25 | 10 | — | — | — | trimethyl orthoformate | 5 | 1,800 |
| Synthesis Example 23 | A-13 | a-9 | 75 | 20 | — | — | 5 | — | — | trimethyl orthoformate | 5 | 1,800 |
| Synthesis Example 24 | A-14 | a-1 | 60 | — | 20 | — | — | 20 | — | trimethyl orthoformate | 5 | 2,300 |
| Synthesis Example 25 | A-15 | — | — | 60 | — | 10 | — | 30 | trimethyl orthoformate | 5 | 1,800 |
| Synthesis Example 26 | A-16 | — | — | 50 | — | — | — | 30 | 20 | trimethyl orthoformate | 5 | 2,200 |

TABLE 2-continued

| | (A) Compound | Amount of polycarbosilane and monomer charged (Si mol %) | | | | | | | Dehydrating agent | Concentration (% mass) | Mw |
|---|---|---|---|---|---|---|---|---|---|---|---|
| | | polycarbosilane | M-1 | M-2 | M-3 | M-4 | M-5 | M-6 | | | |
| Synthesis Example 27 | A-17 | — | — | 65 | 25 | — | 10 | — | — | — | 5 | 1,900 |
| Synthesis Example 28 | A-18 | a-10 | 80 | 20 | — | — | — | — | — | — | 5 | 1,500 |
| Synthesis Example 29 | A-19 | a-1 | 100 | — | — | — | — | — | — | 3A molecular sieves | 5 | 2,500 |

Preparation of Film-Forming Composition for Semiconductor Lithography Process

Components other than the compound (A) which were used in preparation of each film-forming composition for a semiconductor lithography process are indicated below. It is to be noted that in the Examples and the Comparative Examples below, unless otherwise specified particularly, "parts by mass" means a value, provided that a total mass of the components used was 100 parts by mass.

(B) Orthoester
  B-1: trimethyl orthoformate
  B-2: triethyl orthoformate
  B-3: trimethyl orthoacetate
  B-4: triethyl orthoacetate
(C) Solvent
  C-1: propylene glycol monomethyl ether acetate
(D) Other Optional Component(s)
  D-1 (acid generating agent): compound represented by the following formula (D-1)
  D-2 (basic compound): compound represented by the following formula (D-2)

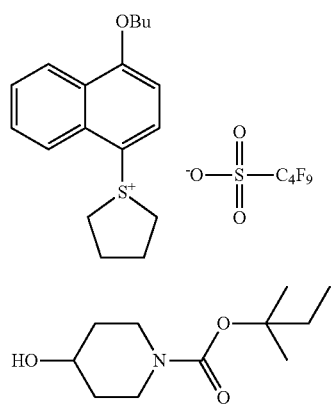

Example 1

A film-forming composition for a semiconductor lithography process (J-1) was prepared by mixing: 0.5 parts by mass of (A-1) as the compound (A) (not including a solvent); 3.00 parts by mass of (B-1) as the orthoester (B); and 96.50 parts by mass of (C-1) as the solvent (C) (including the solvent (C-1) included in the solution of the compound (A)), and filtering a thus resulting solution through a filter having a pore size of 0.2 μm.

Examples 2 to 19 and Comparative Examples 1 to 4

Film-forming compositions (J-2) to (J-19) of Examples 2 to 19, and film-forming compositions (j-1) to (j-4) of Comparative Examples 1 to 4 were prepared similarly to Example 1 except that each component of the type and in the blending amount shown in Table 3 below was used. In Table 3 below, "-" indicates that the corresponding component was not used.

Formation of Silicon-Containing Film

A material for organic underlayer film formation ("HM8006," available from JSR Corporation) was applied on an 8-inch silicon wafer by spin-coating using a spin-coater ("CLEAN TRACK ACT8," available from Tokyo Electron Limited), and thereafter heating was conducted at 250° C. for 60 sec to form an organic underlayer film having an average thickness of 100 nm. Each film-forming composition for a semiconductor lithography process prepared as described above was applied on the organic underlayer film, and subjected to heating at 220° C. for 60 sec, followed by cooling at 23° C. for 30 sec to form a silicon-containing film having an average thickness of 10 nm.

Preparation of Resist Composition

A resist composition was prepared as in the following. Resist composition (R-1) was obtained by: mixing 100 parts by mass of a polymer having a structural unit (1) derived from 4-hydroxystyrene, a structural unit (2) derived from styrene, and a structural unit (3) derived from 4-t-butoxystyrene (proportion of each structural unit contained: (1)/(2)/(3)=65/5/30 (mol %)); 2.5 parts by mass of triphenylsulfonium salicylate as a radiation-sensitive acid generating agent; and as solvents, 4,400 parts by mass of ethyl lactate and 1,900 parts by mass of propylene glycol monomethyl ether acetate, and filtering a thus resulting solution through a filter having a pore size of 0.2 μm.

Evaluations

The resolution, the resist pattern collapse-inhibiting property, resistance to etching by an oxygen-based gas, and the storage stability were evaluated in accordance with the following methods. The results of the evaluations are shown in Table 3 below.

Resolution (Resolution Upon Exposure to Electron Beam)

The resist composition (R-1) was applied on each silicon-containing film formed as described above, and heating was conducted at 130° C. for 60 sec, followed by cooling at 23° C. for 30 sec to form a resist film having an average thickness of 50 nm. Next, the resist film was irradiated with an electron beam by using an electron beam writer ("HL800D," available from Hitachi, Ltd.; output: 50 KeV; electric current density: 5.0 ampere/cm). After the irradiation with the electron beam, the substrate was heated at 110° C. for 60 sec, followed by cooling at 23° C. for 60 sec. Thereafter, a development was carried out using a 2.38% by mass aqueous TMAH solution (20° C. to 25° C.) with a puddle procedure, followed by washing with water and drying to give a substrate for evaluation on which a resist pattern was formed. For line-width measurement and observation of the resist pattern on the substrate for evaluation, a scanning electron microscope ("S-9380," available from Hitachi High-Technologies Corporation) was used. Upon the resist pattern forming, an exposure dose at which a hole pattern with a diameter of 80 nm was formed was defined as an optimum exposure dose. With respect to each hole pattern formed at the optimum exposure dose, the sensitivity was evaluated to be: "A" (favorable) in a case of no residue being confirmed on the resist film; or "B" (unfavorable) in a case of residue being confirmed on the resist film.

Resist Pattern Collapse-Inhibiting Property (Resist Pattern Collapse-Inhibiting Property upon Exposure to Electron Beam)

The resist composition (R-1) was applied on each silicon-containing film formed as described above, and heating was conducted at 130° C. for 60 sec, followed by cooling at 23° C. for 30 sec to form a resist film having an average thickness of 50 nm. Next, the resist film was irradiated with an electron beam by using an electron beam writer ("HL800D," available from Hitachi, Ltd.; output: 50 KeV; electric current density: 5.0 ampere/cm). After the irradiation with the electron beam, the substrate was heated at 110° C. for 60 sec, followed by cooling at 23° C. for 60 sec. Thereafter, a development was carried out using n-butyl acetate (20° C. to 25° C.) with a puddle procedure, followed by drying to give a substrate for evaluation on which a resist pattern was formed. For line-width measurement and observation of the resist pattern on the substrate for evaluation, the aforementioned scanning electron microscope was used. Upon the resist pattern forming, an exposure dose at which a 1:1 line-and-space with a line width of 100 nm was formed was defined as an optimum exposure dose. With respect to each resist pattern formed at the optimum exposure dose, the resist pattern collapse-inhibiting property was evaluated to be: "A" (favorable) in a case in which no resist pattern collapse was confirmed; or "B" (unfavorable) in a case in which resist pattern collapse was confirmed.

Resolution (Resolution upon Exposure to Extreme Ultraviolet Ray)

A material for organic underlayer film formation ("HM8006," available from JSR Corporation) was applied on an 12-inch silicon wafer by spin-coating using a spin-coater ("CLEAN TRACK ACT12," available from Tokyo Electron Limited), and thereafter heating was conducted at 250° C. for 60 sec to form an organic underlayer film having an average thickness of 100 nm. Each film-forming composition for a semiconductor lithography process prepared as described above was applied on the organic underlayer film, and subjected to heating at 220° C. for 60 sec, followed by cooling at 23° C. for 30 sec to form a silicon-containing film having an average thickness of 10 nm. The resist composition (R-1) was applied on each silicon-containing film formed as described above, and heating was conducted at 130° C. for 60 sec, followed by cooling at 23° C. for 30 sec to form a resist film having an average thickness of 50 nm. Next, the resist film was irradiated with an extreme ultraviolet ray using an EUV scanner ("TWINSCAN NXE: 3300B," available from ASML Co.; (NA=0.3; Sigma=0.9: quadrupole illumination, with a hole pattern mask having a diameter of 40 nm in terms of a dimension on wafer)). After the irradiation with the extreme ultraviolet ray, the substrate was heated at 110° C. for 60 sec, followed by cooling at 23° C. for 60 sec. Thereafter, a development was carried out using a 2.38% by mass aqueous TMAH solution (20° C. to 25° C.) with a puddle procedure, followed by washing with water and drying to give a substrate for evaluation on which a resist pattern was formed. For line-width measurement and observation of the resist pattern on the substrate for evaluation, a scanning electron microscope ("CG-4000," available from Hitachi High-Technologies Corporation) was used. Upon the resist pattern forming, an exposure dose at which a hole pattern with a diameter of 40 nm was formed was defined as an optimum exposure dose. With respect to each hole pattern formed at the optimum exposure dose, the sensitivity was evaluated to be: "A" (favorable) in a case of no residue being confirmed on the resist film; or "B" (unfavorable) in a case of residue being confirmed on the resist film.

Resist Pattern Collapse-Inhibiting Property (Resist Pattern Collapse-Inhibiting Property upon Exposure to Extreme Ultraviolet Ray)

A material for organic underlayer film formation ("HM8006," available from JSR Corporation) was applied on an 12-inch silicon wafer by spin-coating using a spin-coater ("CLEAN TRACK ACT12," available from Tokyo Electron Limited), and thereafter heating was conducted at 250° C. for 60 sec to form an organic underlayer film having an average thickness of 100 nm. Each film-forming composition for a semiconductor lithography process prepared as described above was applied on the organic underlayer film, and subjected to heating at 220° C. for 60 sec, followed by cooling at 23° C. for 30 sec to form a silicon-containing film having an average thickness of 10 nm. The resist composition (R-1) was applied on each silicon-containing film formed as described above, and heating was conducted at 130° C. for 60 sec, followed by cooling at 23° C. for 30 sec to form a resist film having an average thickness of 50 nm. Next, the resist film was irradiated with an extreme ultraviolet ray using an EUV scanner ("TWINSCAN NXE: 3300B," available from ASML Co.; (NA=0.3; Sigma=0.9: quadrupole illumination, with a 1:1 line-and-space mask having a line width of 25 nm in terms of a dimension on wafer)). After the irradiation with the extreme ultraviolet ray, the substrate was heated at 110° C. for 60 sec, followed by cooling at 23° C. for 60 sec. Thereafter, a development was carried out using n-butyl acetate (20° C. to 25° C.) with a puddle procedure, followed by drying to give a substrate for evaluation on which a resist pattern was formed. For line-width measurement and observation of the resist pattern on the substrate for evaluation, a scanning electron microscope ("CG-4000," available from Hitachi High-Technologies Corporation) was used. For the substrate for evaluation, an exposure dose at which a 1:1 line-and-space with a line width of 25 nm was formed was defined as an optimum exposure dose. With respect to each resist pattern formed at the optimum exposure dose, the resist pattern collapse-inhibiting property was evaluated to be: "A" (favorable) in a case in which no resist pattern collapse was confirmed; or "B" (unfavorable) in a case in which resist pattern collapse was confirmed.

Resistance to Etching by Oxygen-Based Gas

The film-forming composition for a semiconductor lithography process prepared as described above was applied on an 8-inch silicon wafer by spin-coating using a spin-coater ("CLEAN TRACK ACT8," available from Tokyo Electron Limited), and thereafter heating was conducted at 220° C. for 60 sec, followed by cooling at 23° C. for 30 sec to form a silicon-containing film having an average thickness of 20 nm.

The substrate on which the silicon-containing film was formed was subjected to an etching treatment by using an etching apparatus ("Tactras-Vigus" available from Tokyo Electron Limited), under conditions involving $O_2$=400 sccm, PRESS. =25 mT, HF RF (radiofrequency power for plasma production)=200 W, LF RF (radiofrequency power for bias)=0 W, DCS=0 V, and RDC (flow rate percentage at gas center)=50%, for 60 sec. An etching rate (nm/min) was calculated from average film thicknesses of the silicon-containing film before and after the treatment, and resistance to etching by the oxygen-based gas was evaluated. The etching resistance was evaluated to be: "A" (favorable) in a case in which the etching rate was less than 5.0 nm/min; and "B" (unfavorable) in a case in which the etching rate was no less than 5.0 nm/min.

Storage Stability

The film-forming composition for a semiconductor lithography process prepared as described above was stored at each of −15° C. and at 40° C. for 7 days, and then a weight average molecular weight (Mw) was determined for the compound (A) in each composition. The storage stability was evaluated to be: "A" (favorable) in a case in which a difference between the Mw following storage at −15° C. for 7 days and the Mw following storage at 40° C. for 7 days was less than 100; "B" (somewhat unfavorable) in a case in which the difference was no less than 100 and less than 1,000; and "C" (unfavorable) in a case in which the difference was no less than 1,000.

TABLE 3

| Film-forming composition | (A) Compound type | (A) blend amount (parts by mass) | (B) Orthoester type | (B) blend amount (parts by mass) | (C) Solvent type | (C) blend amount (parts by mass) | (D) Other optional component type | (D) blend amount (parts by mass) |
|---|---|---|---|---|---|---|---|---|
| Example 1 | J-1 | A-1 | 0.5 | B-1 | 3.00 | C-1 | 96.50 | — | — |
| Example 2 | J-2 | A-1 | 0.5 | B-1 | 3.00 | C-1 | 96.49 | D-1 | 0.01 |
| Example 3 | J-3 | A-2 | 0.5 | B-2 | 3.00 | C-1 | 96.50 | — | — |
| Example 4 | J-4 | A-3 | 0.5 | B-3 | 3.00 | C-1 | 96.50 | — | — |
| Example 5 | J-5 | A-4 | 0.5 | B-4 | 3.00 | C-1 | 96.50 | — | — |
| Example 6 | J-6 | A-5 | 0.5 | B-2 | 3.00 | C-1 | 96.50 | — | — |
| Example 7 | J-7 | A-6 | 0.5 | B-2 | 3.00 | C-1 | 96.50 | — | — |
| Example 8 | J-8 | A-7 | 0.5 | B-2 | 3.00 | C-1 | 96.50 | — | — |
| Example 9 | J-9 | A-8 | 0.5 | B-1 | 3.00 | C-1 | 96.50 | — | — |
| Example 10 | J-10 | A-9 | 0.5 | B-1 | 3.00 | C-1 | 96.49 | D-2 | 0.01 |
| Example 11 | J-11 | A-10 | 0.5 | B-3 | 3.00 | C-1 | 96.50 | — | — |
| Example 12 | J-12 | A-11 | 0.5 | B-4 | 3.00 | C-1 | 96.50 | — | — |
| Example 13 | J-13 | A-12 | 0.5 | B-1 | 3.00 | C-1 | 96.50 | — | — |
| Example 14 | J-14 | A-13 | 0.5 | B-2 | 3.00 | C-1 | 96.50 | — | — |
| Example 15 | J-15 | A-14 | 0.5 | B-2 | 3.00 | C-1 | 96.50 | — | — |
| Example 16 | J-16 | A-15 | 0.5 | B-2 | 3.00 | C-1 | 96.50 | — | — |
| Example 17 | J-17 | A-16 | 0.5 | B-2 | 3.00 | C-1 | 96.50 | — | — |
| Example 18 | J-18 | A-1 | 0.5 | B-1 | 2.00 | C-1 | 97.50 | — | — |
| Example 19 | J-19 | A-1 | 0.5 | B-1 | 1.00 | C-1 | 98.50 | — | — |
| Example 20 | J-20 | A-1 | 0.5 | B-1 | 0.30 | C-1 | 98.50 | — | — |
| Comparative Example 1 | j-1 | A-1 | 0.5 | — | — | C-1 | 99.50 | — | — |
| Comparative Example 2 | j-2 | A-17 | 0.5 | — | — | C-1 | 96.50 | — | — |
| Comparative Example 3 | j-3 | A-18 | 0.5 | — | — | C-1 | 96.50 | — | — |
| Comparative Example 4 | j-4 | A-19 | 0.5 | — | — | C-1 | 96.50 | — | — |

| | Evaluation results | | | | | |
|---|---|---|---|---|---|---|
| | Resolution | | Resist pattern collapse-inhibiting property | | Resistance to etching by Oxygen-based gas | Storage stability |
| | electron beam | extreme ultraviolet ray | electron beam | extreme ultraviolet ray | | |
| Example 1 | A | A | A | A | A | A |
| Example 2 | A | A | A | A | A | A |
| Example 3 | A | A | A | A | A | A |
| Example 4 | A | A | A | A | A | A |
| Example 5 | A | A | A | A | A | A |
| Example 6 | A | A | A | A | A | A |
| Example 7 | A | A | A | A | A | A |
| Example 8 | A | A | A | A | A | A |
| Example 9 | A | A | A | A | A | A |
| Example 10 | A | A | A | A | A | A |
| Example 11 | A | A | A | A | A | A |
| Example 12 | A | A | A | A | A | A |
| Example 13 | A | A | A | A | A | A |
| Example 14 | A | A | A | A | A | A |

TABLE 3-continued

| | | | | | | |
|---|---|---|---|---|---|---|
| Example 15 | A | A | A | A | A | A |
| Example 16 | A | A | A | A | A | A |
| Example 17 | A | A | A | A | A | A |
| Example 18 | A | A | A | A | A | A |
| Example 19 | A | A | A | A | A | A |
| Example 20 | A | A | A | A | A | A |
| Comparative Example 1 | B | B | B | B | A | B |
| Comparative Example 2 | A | A | A | A | B | A |
| Comparative Example 3 | A | A | A | A | B | A |
| Comparative Example 4 | B | B | B | B | A | C |

As is seen from the results shown in Table 3, the film-forming compositions of the Examples were superior in storage stability, and the silicon-containing films formed therefrom were favorable with regard to each of resist film resolution, the resist pattern collapse-inhibiting property, and resistance to etching by an oxygen-based gas. To the contrary, the film-forming compositions of the Comparative Examples were inferior in at least one of storage stability, resolution, the resist pattern collapse-inhibiting property, and resistance to etching by an oxygen-based gas.

According to the film-forming composition of the one embodiment of the present invention, storage stability in which the film-forming composition is superior is demonstrated, and formation of a silicon-containing film which is superior with regard to each of a resist film resolution, a resist pattern collapse-inhibiting property, and resistance to etching by an oxygen-based gas is enabled. The silicon-containing film of the one embodiment of the present invention is superior in the resist film resolution, the resist pattern collapse-inhibiting property, and resistance to etching by an oxygen-based gas. The resist pattern-forming method of the one embodiment of the present invention enables formation of a resist pattern with the resist film resolution, the resist pattern collapse-inhibiting property, and resistance to etching by an oxygen-based gas each being superior. Therefore, these can be suitably used in the manufacture of semiconductor devices and the like, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A resist pattern-forming method comprising:
   applying a film-forming composition directly or indirectly on an upper face of a substrate to form a silicon-containing film;
   applying a resist composition on an upper face of the silicon-containing film to form a resist film;
   exposing the resist film; and
   developing the resist film exposed, wherein
   the film-forming composition comprises:
      a polymer comprising a carbosilane structural unit represented by formula (1-2); and
      an orthoester represented by formula (4):

(1-2)

wherein, in the formula (1-2), c is an integer of 1 to 3; $R^2$ represents a hydroxy group, a halogen atom, or a monovalent organic group having 1 to 20 carbon atoms; d is an integer of 0 to 2, wherein in a case in which d is 2, two $R^2$s are identical or different; $R^3$ represents a substituted or unsubstituted divalent hydrocarbon group having 1 to 20 carbon atoms that bonds to two Si atoms; and p is an integer of 1 to 3, wherein in a case in which p is no less than 2, a plurality of R's are identical or different, and wherein a sum of c, d, and p is less than 4,

(4)

wherein, in the formula (4), $R^8$ represents a hydrogen atom or a substituted or unsubstituted monovalent hydrocarbon group having 1 to 20 carbon atoms; and each $R^9$ independently represents an unsubstituted monovalent hydrocarbon group having 1 to 20 carbon atoms.

2. The resist pattern-forming method according to claim 1, wherein an exposure light used in the exposing is an extreme ultraviolet ray or an electron beam.

3. The resist pattern-forming method according to claim 1, further comprising carrying out etching after the developing.

4. The resist pattern-forming method according to claim 1, further comprising, before the applying of the film-forming composition, forming an organic underlayer film directly or indirectly on the upper face of the substrate.

5. The resist pattern-forming method according to claim 1, wherein the polymer further comprises a first structural unit that is a structural unit represented by formula (1-1),

(1-1)

wherein, in the formula (1-1), a is an integer of 1 to 3; $R^1$ represents a hydroxy group, a halogen atom, or a monovalent organic group having 1 to 20 carbon atoms; and b is an integer of 0 to 2, wherein in a case in which b is 2, two R's are identical or different, and wherein a sum of a and b is no greater than 3.

6. The resist pattern-forming method according to claim 5, wherein a total of an amount of the carbosilane structural unit and an amount of the first structural unit in the polymer is 30 to 90 mol % with respect to total structural units constituting the polymer.

7. The resist pattern-forming method according to claim 1, wherein the polymer further comprises a second structural unit that is a structural unit represented by formula (2-1), a structural unit represented by formula (2-2), or a combination thereof, $$(SiO_{4/2}) \quad (2\text{-}1)$$

$$(R^4_{q/2}SiO_{(4-q)/2}) \quad (2\text{-}2)$$

wherein, in the formula (2-2), $R^4$ represents a substituted or unsubstituted divalent hydrocarbon group having 1 to 20 carbon atoms that bonds to two Si atoms; and q is an integer of 1 to 4, wherein in a case in which q is no less than 2, a plurality of $R^4$s are identical or different.

8. The resist pattern-forming method according to claim 7, wherein the polymer further comprises a third structural unit that is a structural unit represented by formula (3-1), a structural unit represented by formula (3-2), or a combination thereof,

wherein, in the formula (3-1), $R^5$ represents a hydroxy group, a halogen atom, or a monovalent organic group having 1 to 20 carbon atoms; and e is an integer of 1 to 3, wherein in a case in which e is no less than 2, a plurality of $R^5$s are identical or different, and in the formula (3-2), $R^6$ represents a hydroxy group, a halogen atom, or a monovalent organic group having 1 to 20 carbon atoms; f is 1 or 2, wherein in a case in which f is 2, two $R^6$s are identical or different; $R^7$ represents a substituted or unsubstituted divalent hydrocarbon group having 1 to 20 carbon atoms that bonds to two Si atoms; and r is an integer of 1 to 3, wherein in a case in which r is no less than 2, a plurality of R's are identical or different, and wherein a sum of f and r is no greater than 4.

9. The resist pattern-forming method according to claim 8, wherein an amount of the third structural unit in the polymer is 5 to 60 mol % with respect to total structural units constituting the polymer.

10. The resist pattern-forming method according to claim 7, wherein an amount of the second structural unit in the polymer is 5 to 70 mol % with respect to total structural units constituting the polymer.

11. The resist pattern-forming method according to claim 1, wherein the polymer further comprises a third structural unit that is a structural unit represented by formula (3-1), a structural unit represented by formula (3-2), or a combination thereof,

wherein, in the formula (3-1), $R^5$ represents a hydroxy group, a halogen atom, or a monovalent organic group having 1 to 20 carbon atoms; and e is an integer of 1 to 3, wherein in a case in which e is no less than 2, a plurality of $R^5$s are identical or different, and in the formula (3-2), $R^6$ represents a hydroxy group, a halogen atom, or a monovalent organic group having 1 to 20 carbon atoms; f is 1 or 2, wherein in a case in which f is 2, two R's are identical or different; $R^7$ represents a substituted or unsubstituted divalent hydrocarbon group having 1 to 20 carbon atoms that bonds to two Si atoms; and r is an integer of 1 to 3, wherein in a case in which r is no less than 2, a plurality of $R^7$s are identical or different, and wherein a sum of f and r is no greater than 4.

12. The resist pattern-forming method according to claim 11, wherein an amount of the third structural unit in the polymer is 5 to 70 mol % with respect to total structural units constituting the polymer.

13. The resist pattern-forming method according to claim 1, wherein the polymer has a weight average molecular weight of 1,000 to 100,000.

14. The resist pattern-forming method according to claim 13, wherein the polymer has the weight average molecular weight of 1,500 to 3,000.

15. The resist pattern-forming method according to claim 1, wherein the orthoester is at least one selected from the group consisting of an orthoformic acid ester, an orthoacetic acid ester, and an orthopropionic acid ester.

16. The resist pattern-forming method according to claim 1, wherein an amount of the orthoester in the film-forming composition is 10 to 10,000 parts by mass with respect to 100 parts by mass of the polymer.

17. The resist pattern-forming method according to claim 1, wherein an amount of the orthoester in the film-forming composition is 300 to 2,000 parts by mass with respect to 100 parts by mass of the polymer.

18. The resist pattern-forming method according to claim 1, wherein an amount of the orthoester in the film-forming composition is 500 to 1,000 parts by mass with respect to 100 parts by mass of the polymer.

19. The resist pattern-forming method according to claim 1, wherein the film-forming composition further comprises a solvent.

20. The resist pattern-forming method according to claim 1, wherein the film-forming composition further comprises at least one of an acid generating agent and a basic compound.

* * * * *